United States Patent
Ohigashi

(10) Patent No.: US 6,843,941 B2
(45) Date of Patent: Jan. 18, 2005

(54) METHOD FOR FABRICATING A FERROELECTRIC POLYMER FILM

(75) Inventor: Hiroji Ohigashi, Zushi (JP)

(73) Assignee: Hiroj Ohigashi, Zushi (JP)

( * ) Notice: Subject to any disclaimer, the term of this patent is extended or adjusted under 35 U.S.C. 154(b) by 246 days.

(21) Appl. No.: 10/133,747

(22) Filed: Apr. 29, 2002

(65) Prior Publication Data

US 2003/0052437 A1 Mar. 20, 2003

(30) Foreign Application Priority Data

Sep. 10, 2001  (JP) ........................................ 2001-273145

(51) Int. Cl.⁷ ........................ B29C 55/04; B29C 55/06; B29C 69/02; B29C 71/02
(52) U.S. Cl. ........................... 264/2.6; 264/2.7; 264/85; 264/210.1; 264/210.5; 264/235.6; 264/288.4; 264/291; 264/346; 264/435
(58) Field of Search ........................... 264/2.6, 2.7, 85, 264/210.1, 210.5, 235.6, 288.4, 291, 346, 435

(56) References Cited

U.S. PATENT DOCUMENTS

| | | | | |
|---|---|---|---|---|
| 3,869,534 A | * | 3/1975 | Yoshikawa et al. | ...... 264/210.1 |
| 3,878,274 A | * | 4/1975 | Murayama et al. | ........ 264/1.36 |
| 4,508,668 A | * | 4/1985 | Broussoux et al. | ......... 264/435 |
| 4,578,442 A | * | 3/1986 | Ohigashi et al. | ............ 526/255 |
| 4,692,285 A | * | 9/1987 | Bloomfield et al. | ........ 264/435 |
| 4,778,867 A | * | 10/1988 | Pries | ........................... 526/255 |
| 4,800,048 A | * | 1/1989 | Bloomfield et al. | ........ 264/435 |
| 4,808,352 A | * | 2/1989 | Bhateja | ...................... 264/435 |
| 5,254,296 A | * | 10/1993 | Perlman | ..................... 264/435 |
| 5,288,551 A | * | 2/1994 | Sato et al. | ................... 428/334 |
| 5,410,210 A | * | 4/1995 | Sato et al. | ................... 310/363 |
| 5,480,692 A | * | 1/1996 | Nicolai et al. | ............. 428/35.1 |
| 5,679,753 A | * | 10/1997 | Ohigashi et al. | ............ 526/255 |
| 6,512,064 B2 | * | 1/2003 | Higuchi et al. | ............. 526/250 |

FOREIGN PATENT DOCUMENTS

JP         2681032 B2     8/1997

OTHER PUBLICATIONS

Machine translation of JP 08–036917 A, May 2004, Japanese Patent Office website.*

* cited by examiner

Primary Examiner—Michael P. Colaianni
Assistant Examiner—Michael I. Poe
(74) Attorney, Agent, or Firm—Randall J. Knuth

(57) ABSTRACT

A film made of a vinylidene-trifluoroethylene or tetrafluoroethylene copolymer is uniaxially drawn to fabricate a uniaxially drawn film. Then, the uniaxially drawn film is thermally treated at a temperature within a temperature range of the Curie temperature through the melting point of the vinylidene-trifluoroethylene or tetrafluoroethylene copolymer for five hours or over, to diffuse the molecular chains of the uniaxially drawn film along the orientation direction and thus, to remove the intertwining between the molecular chains.

12 Claims, 1 Drawing Sheet

METHOD FOR FABRICATING A FERROELECTRIC POLYMER FILM

BACKGROUND OF THE INVENTION

1. Field of the Invention

This invention relates to a method for fabricating ferroelectric polymer film, preferably usable for a piezoelectric element, a pyroelectric element, an opto-electrical element, and a non-linear optical element.

2. Description of the Prior Art

A film made of a ferroelectric polymer has larger flexibility than a film made of a ferroelectric inorganic material, and has a large piezoelectric effect induced by poling treatment. Therefore, the ferroelectric polymer film may be used as material for various piezoelectric devices, and particularly, employed aggressively for piezoelectric sensors and transducers because of the low acoustic impedance.

As a ferroelectric polymer film with a large electromechanical conversion efficiency, a copolymer of vinylidene fluoride and trifluoroethylene or tetrafluoroethylene is well known. The ferroelectric copolymer film is composed of the aggregation of plural lamellar crystal portions, where the mechanical properties and breaking strength are determined on the cohesive forces between the adjacent crystal portions. Therefore, the ferroelectric copolymer film is fragile and can not exhibit flexibility peculiar to a polymer.

In this point of view, the inventor has conceived to fabricate a uniaxially drawn film made of a copolymer of vinylidene fluoride and trifluoroethylene and to thermally treat and thus, crystallize the uniaxially drawn film with keeping the surfaces of the uniaxially drawn film in free surface condition, thereby to obtain a ferroelectric single crystalline polymer film (Japanese Patent No. 2681032). In this case, the molecular chains of such a ferroelectric single crystalline polymer film are oriented in the drawing direction at high degree, and also, the crystal axes (a axis and b axis) perpendicular to the drawing direction are oriented in given directions within the plane perpendicular to the drawing direction. Moreover, in the ferroelectric single crystalline polymer film, extended chain crystal portions are created and thus, the lamellar crystal portions are vanished.

As a result, the longitudinal wave velocity and the Young's modulus of the ferroelectric single crystalline polymer film can be improved up to 7930 m/sec and 121 GPa at a temperature of 10K (−263° C.) and up to 3800 m/sec and 27.9 GPa at a temperature of 300K (27° C.), respectively. The above physical properties are much larger than a lamellar crystalline polymer film.

However, the Young's modulus of the ferroelectric single crystalline copolymer film of vinylidene fluoride and trifluoroethylene is theoretically estimated 230 GPa, and thus, the current Young's modulus as mentioned above is extremely smaller than the theoretical value. In a sensor or transducer utilizing piezoelectric effect, the electromechanical conversion efficiency becomes larger as the young's modulus becomes larger. Therefore, it is desired to enhance the Young's modulus of such a ferroelectric single crystalline copolymer film.

SUMMERY OF THE INVENTION

It is an object of the present invention to provide a new method for fabricating a ferroelectric copolymer film made of vinylidene fluoride and trifluoroethylene or tetrafluoroethylene of which the Young's modulus is enhanced.

In order to achieve the above object, this invention relates to a method for fabricating a ferroelectric polymer film including a vinylidene-trifluoroethylene or tetrafluoroethylene copolymer, comprising the steps of:

fabricating a film made of a vinylidene-trifluoroethylene or tetrafluoroethylene copolymer, uniaxially drawing said film to fabricate a uniaxially drawn film, and diffusing the molecular chains of said uniaxially drawn film along the orientation direction of said uniaxially drawn film, to fabricate a ferroelectric polymer film where molecular chains are not intertwined.

The inventor had been intensely studied to achieve the above object. Then, the inventor had conceived that the low Young's modulus of the ferroelectric single crystalline copolymer film is originated from defects such as the intertwining between the molecular chains, loop structure and kink band structure created at the intertwining portions. Therefore, the inventor also had intensely studied to find out the means to prevent the intertwining of molecular chain.

As a result, the inventor found out that a uniaxially drawn film made of vinylidene and trifluorethylene or tetrafluoroethylene has a liquid property in the paraelectric phase condition. That is, in the paraelectric phase condition, the molecular chains of the uniaxially drawn film are easily diffused in the orientation direction of the molecular chain which corresponds to the drawing direction, and not almost diffused in the direction perpendicular to the surfaces of the film which corresponds to the direction perpendicular to the orientation direction. So, the inventor conceived that if the molecular chains are diffused in the molecular chain orientating direction, the intertwining between the molecular chains can be prevented, and thus, create the present invention.

According to the fabricating method of the present invention, since the intertwining between the molecular chains are substantially removed from the thus obtained ferroelectric polymer film, the loop structures and the kink band structures can be also removed. As a result, the Young's modulus of the ferroelectric polymer film can be much enhanced than that of a conventional ferroelectric polymer film as mentioned above, and thus, preferably usable for an electromechanical conversion element such as a sensor or transducer utilizing piezoelectric effect and another piezoelectric element.

BRIEF DESCRIPTION OF THE DRAWINGS

For better understanding of the present invention, reference is made to the attached drawing, wherein.

DESCRIPTION OF THE PREFERRED EMBODIMENTS

Figure 1:
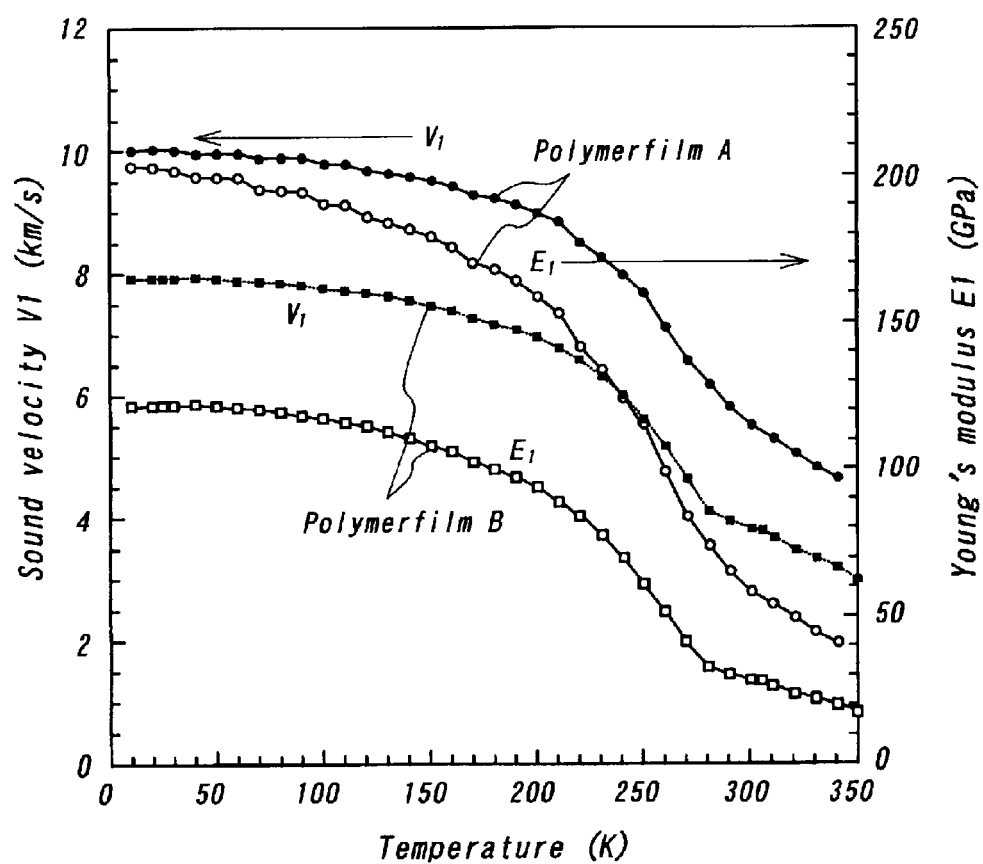
FIG. 1 is a graph showing the temperature dependence of the Young's modulus and the longitudinal wave velocity of a ferroelectric polymer film made of vinylidene fluoride-trifluoroethylene copolymer.

This invention will be described in detail with reference to the accompanying drawings. In the present invention, it is required that the molecular chains of the vinylidene fluoride-trifluoroethylene or tetrafluoroethylene copolymer composing a ferroelectric polymer film are diffused in the orientation direction thereof, to substantially remove the intertwining between the molecular chains. The concrete means to remove the intertwining is not restricted.

For example, the above diffusion for the molecular chains can be performed by thermally treating a uniaxially drawn film made of the copolymer for five hours or over, particularly 20 hours or over at a temperature within the Curie temperature and the melting point of the copolymer, that is, in the paraelectric phase condition of the copolymer.

As the thermal treatment temperature becomes near the melting point of the copolymer, the thermal treatment period of time can be shortened, and the diffusion can be performed effectively. Therefore, it is desired that the thermal treatment is performed at a temperature where the uniaxially drawn film is partially melted to negligible degree. Concretely, it is desired that the thermal treatment is performed at a temperature within a range of (Tm−3)° C.–(Tm−10)° C. if the melting point of the uniaxially drawn film is measured as Tm from DSC measurement.

Moreover, the diffusion for the molecular chains can be performed by setting the uniaxially drawn film under a compressed condition of 0.2 MPa or over, particularly 50 MPa or over and thermally treating the uniaxially drawn film under the compressed condition. In this case, too, the thermal treatment period of time can be shortened and the diffusion can be performed effectively. If the compressed condition is set to 100 MPa or over, the above effects can be much enhanced.

The upper limited value of pressure at the compressed condition is not restricted only if the paraelectric phase created at the compressed condition is not thermally degraded by the thermal treatment. At present, the diffusion can be performed even under 500 MPa without the thermal degradation, to remove the intertwining between the molecular chains.

It is desired that in the thermal treatment, the uniaxially drawn film is set to be in free surface condition. If an external force acts on the surfaces of the uniaxially drawn film, the orientation of the molecular chains may be locally disordered, resulting in the diffusion of the molecular chains being disturbed because the orientation disorder may function as a nucleus to cause the crystal grow in a different direction from the drawing direction. Therefore, if the uniaxially drawn film is set to be in the free surface condition, the local disorder of the molecular chain orientation can be sufficiently prevented, and then, the diffusion for the molecular chains can be performed in the orientation direction sufficiently.

The thermal treatment in the free surface condition may be carried out as follows. The uniaxially drawn film is set on a base made of a non-adhesive material to vinylidene fluoride-trifluoroethylene copolymer composing the film, for example Teflon, and then, the base including the film is set under a gaseous atmosphere or a liquid atmosphere. In this case, the surfaces of the uniaxially drawn film can be maintained in the free surface condition. Thereafter, the gaseous atmosphere or the liquid atmosphere is compressed up to a predetermined pressure within the above-mentioned pressure range.

As the preferable gaseous atmosphere can be exemplified non-oxidizing atmosphere such as inert gaseous atmosphere, nitrogen atmosphere or air. As the preferable liquid atmosphere can be exemplified non-dissolving liquid atmosphere utilizing silicone oil, ethylene glycol or kerosene.

For realizing the diffusion for the molecular chains more effectively and thus, removing the intertwining between the molecular chains more sufficiently, the content of vinylidene fluoride for the vinylidene fluoride-trifluoroethylene or tetrafluoroethylene copolymer is preferably set within 65–90 mol %, particularly within 70–85 mol %.

Similarly, the thickness of the uniaxially drawn film made of the copolymer is preferably set within 1 μm–1 mm, particularly within 3 μm–200 μm.

EXAMPLES

The present invention will be described concretely, with reference to Examples.

Example 1

Vinylidene fluoride-trifluoroethylene copolymer pellets, each including vinylidene fluoride at a ratio of 75 mol % and having a molecular weight of about 200,000, were dissolved into dimethylformamide (DMF), to make a vinylidene fluoride-trifluoroethylene copolymer solution. Then, the solution was flowed or cast on a glass plate, to remove the DMF and thus, to fabricate a vinylidene fluoride-trifluoroethylene copolymer film. The Curie temperature and the melting point of the copolymer film were 120° C. and 149° C., respectively.

Then, the copolymer film was uniaxially drawn by five times, to fabricate a uniaxially drawn film in a thickness of 40 μm. Then, the uniaxially drawn film was set on a Teflon plate, and both ends were fixed. Then, the uniaxially drawn film was thermally treated at 140° C. in air under a compressed condition of 0.1 MPa for 90 hours, to fabricate a ferroelectric polymer film.

In the ferroelectric polymer film, the coherence length ($D_{001}$), the FWHM in X-ray rocking curve $\Delta_{\chi 001}$ of the drawing direction (orientation direction: c-axis direction), the FWHM in X-ray rocking curve $\Delta\omega_{110/200}$ of the direction perpendicular to the <110> or <200> crystal plane were measured. Then, the Curie temperature and the melting point Tm were measured. The measured results are listed in Table 1.

Example 2

Except that the thermal treatment period of time was set to 450 hours, a ferroelectric polymer film was fabricated in the same manner as in Example 1. In the ferroelectric polymer film, the coherence length ($D_{001}$), the FWHM in X-ray rocking curve $\Delta_{\chi 001}$ of the drawing direction (orientation direction: c-axis direction), the FWHM in X-ray rocking curve $\Delta\omega_{100/200}$ of the direction perpendicular to the <110> or <200> crystal plane were measured. Then, the Curie temperature and the melting point Tm were measured. The measured results are listed in Table 1.

Example 3

Except that the thermal treatment temperature was set to 145° C. and the thermal treatment period of time was set to 80 hours, a ferroelectric polymer film was fabricated in the same manner as in Example 1. In the ferroelectric polymer film, the coherence length ($D_{001}$), the FWHM in X-ray rocking curve $\Delta_{\chi 001}$ of the drawing direction (orientation direction: c-axis direction), the FWHM in X-ray rocking curve $\Delta\omega_{100/200}$ of the direction perpendicular to the <110> or <200> crystal plane were measured. Then, the Curie temperature and the melting point Tm were measured. The measured results are listed in Table 1.

Example 4

A uniaxially drawn film was fabricated as in Example 1, and set on a Teflon plate so that both ends were fixed, and then, immersed in silicone oil. Then, an external pressure of 300 MPa was applied to the silicone oil and under the compressed condition, the uniaxially drawn film was thermally treated at 280° C. for one hour, to fabricate a ferroelectric polymer film desired. Thereafter, in the ferroelectric polymer film, the coherence length ($D_{001}$), the FWHM in X-ray rocking curve $\Delta\chi_{001}$ of the drawing direction (orientation direction: c-axis direction), the FWHM in X-ray rocking curve $\Delta\omega_{100/200}$ of the direction perpendicular to the <110> or <200> crystal plane were measured. Then, the Curie temperature and the melting point Tm were measured. The measured results are listed in Table 1.

Example 5

Except that the thermal treatment period of time was set to 2 hours, a ferroelectric polymer film was fabricated in the same manner as in Example 1. In the ferroelectric polymer film, the coherence length ($D_{001}$), the FWHM in X-ray rocking curve $\Delta\chi_{001}$ of the drawing direction (orientation direction: c-axis direction), the FWHM in X-ray rocking curve $\Delta\omega_{110/200}$ of the direction perpendicular to the <110> or <200> crystal plane were measured. Then, the Curie temperature and the melting point Tm were measured. The measured results are listed in Table 1.

(hereinafter, called as a "polymer film A"), and then, poling treatment was carried out for the polymer film A via the Al films. In this case, the spontaneous polarization Pr was 110 $mC/m^2$ and the electric coercive field was 38 MV/m.

Then, the polymer film A was cut along the orientation direction of the molecular chains thereof into pieces, each having a width of 2.5 mm and a length of 25 mm. Then, the electric admittance and the frequency dependence at various temperatures for each piece was measured, and thus, the longitudinal wave velocity V1 and the Young's modulus E1 of the polymer film A were measured in the orientation direction of the molecular chains of the polymer film A. The measured results are shown in FIG. 1.

Example 7

Al films were fabricated on both sides of the ferroelectric polymer film in Example 5 (hereinafter, called as a "polymer film B", and the polymer film B was cut out into pieces in the same manner as in Example 6. Then, the longitudinal

TABLE 1

| | Thermal treatment condition | | | Curie temperature (° C.) | Melting point (° C.) | $D_{001}$ (Å) | $\Delta\chi_{001}$ (deg) | $\Delta\omega_{110/200}$ (deg) |
|---|---|---|---|---|---|---|---|---|
| | pressure (MPa) | temperature (° C.) | hour | | | | | |
| Example 1 | 0.1 | 140 | 90 | 124 | 153 | 350 | 5 | 7 |
| Example 2 | 0.1 | 140 | 450 | 123.8 | 153.9 | 360 | 4 | 6.5 |
| Example 3 | 0.1 | 145 | 80 | 124.1 | 152.5 | 466 | 4.2 | 5.2 |
| Example 4 | 300 | 280 | 1 | 125.9 | 153 | 542 | 6 | 5.3 |
| Example 5 | 0.1 | 140 | 2 | 125.7 | 149.4 | 235 | 6.2 | 14 |

As is apparent from Table 1, the coherence lengths ($D_{001}$) of the ferroelectric polymer films in Examples 1–3 where the thermal treatment was carried out for 80 hours or over and the ferroelectric polymer film in Example 4 where the thermal treatment was carried out under a compressed condition are larger than that of the ferroelectric polymer film in Example 5 where the thermal treatment was carried out for 2 hours. The increase of the coherence length ($D_{001}$) means the enhancement of the regularity in orientation of the ferroelectric polymer film.

Moreover, the FWHM in X-ray rocking curve $\Delta\chi_{001}$ and the FWHM in X-ray rocking curve $\Delta\omega_{110/200}$ of the ferroelectric polymer films in Examples 1–4 are smaller than those of the ferroelectric polymer film in Example 5. The decrease of FWHM also means the enhancement in orientation of the ferroelectric polymer film.

In addition, the melting points Tm of the ferroelectric polymer films in Examples 1–4 are larger than that of the ferroelectric polymer film in Example 5. The increase of the melting point Tm means the decrease of the free energy in the paraelectric phase of the ferroelectric polymer film and thus, a large amount of defect are removed from in the ferroelectric polymer film.

As is apparent from the above description, in the ferroelectric polymer films in Examples 1–3 where the thermal treatment was carried out for a long period of time and the ferroelectric polymer film in Example 4 where the thermal treatment was carried out under a compressed condition, the diffusion for the molecular chains are performed sufficiently, and thus, the intertwining between the molecular chains is removed substantially. However, even the ferroelectric polymer film in Example 5 where the thermal treatment is carried out for a short period of time can be applied for various uses.

Example 6

Al films were fabricated in a thickness of 90 nm on both sides of the ferroelectric polymer film in Example 1 wave velocity V1 and the Young's modulus E1 of the polymer film B were measured in the same manner as in Example 6. The measured results are shown in FIG. 1.

As is apparent from FIG. 1, the polymer film A has a large Young's modulus E1 because the diffusion for the molecular chains is performed sufficiently and thus, the intertwining between the molecular chains is removed and defects at the intertwining portions are decreased. Concretely, the Young's modulus E1 is 203 GPa at 10K and 58.4 GPa at 300K, respectively, which are extremely larger than those of a conventional ferroelectric polymer film made of a vinylidende fluoride-trifluoroethylene copolymer.

Moreover, since the polymer film A has a high longitudinal wave velocity V1 almost equal to the velocity theoretically estimated for an ideal crystal of a copolymer of vinylidene fluoride and trifluoroethylene, the molecular chains in the polymer film A are oriented regularly.

On the other hand, the polymer film B has a relatively small Young's modulus of 121 GPa at 10K or 27.9 GPa at 300K which is a smaller than the theoretically estimated Young's modulus because the diffusion for the molecular chains is not performed sufficiently and thus, the intertwining between the molecular chains is not removed perfectly. Since the polymer film B also has a relatively small longitudinal wave velocity V1, the molecular chains in the polymer film B are not oriented regularly because of the insufficiently diffusion for the molecular chains.

Although the present invention was described in detail with reference to the above examples, this invention is not limited to the above disclosure and every kind of variation and modification may be made without departing from the scope of the present invention.

As mentioned above, in a ferroelectric polymer film made of a vinylidene-trifluoroethylene or tetrafluoroethylene copolymer, the intertwining between the molecular chains is prevented through the diffusion of the molecular chains, and thus, various defects are almost vanished, according to the present invention. Therefore, the orientation of the ferroelectric polymer film can be enhanced and thus, the Young's modulus can be enhanced.

What is claimed is:

1. A method for fabricating a ferroelectric polymer film including a vinylidene-trifluoroethylene or tetrafluoroethylene copolymer, comprising the steps of:

fabricating a film made of a vinylidene-trifluoroethylene or tetrafluoroethylene copolymer, uniaxially drawing said film to fabricate a uniaxially drawn film, and diffusing the molecular chains of said uniaxially drawn film along the orientation direction of said uniaxially drawn film, to fabricate a ferroelectric polymer film where molecular chains are not intertwined.

2. A fabricating method as defined in claim 1, wherein the content of vinylidene fluoride in said vinylidene-trifluoroethylene or tetrafluoroethylene copolymer is set within 65–90 mol %.

3. A fabricating method as defined in claim 1, wherein the thickness of said uniaxially drawn film is set within 1 μm through 1 mm.

4. A fabricating method as defined in claim 1, wherein diffusing the molecular chains of said uniaxially drawn film is performed by thermally treating said uniaxially drawn film at a temperature within a temperature range of the Curie temperature through the melting point of said vinylidene-trifluoroethylene or tetrafluoroethylene copolymer composing said uniaxially drawn film for five hours or over.

5. A fabricating method as defined in claim 4, wherein the thermal treatment is carried out for 20 hours or over.

6. A fabricating method as defined in claim 4, wherein the thermal treatment is performed so that the surfaces of said uniaxially drawn film parallel to the drawing direction are maintained in free surface condition.

7. A fabricating method as defined in claim 6, wherein the thermal treatment is performed so that said uniaxially drawn film is set on a base made of a non-adhesive material to said vinylidene-trifluoroethylene or tetrafluoroethylene copolymer in a gaseous atmosphere or a liquid atmosphere and then, said surfaces of said uniaxially drawn film are maintained in the free surface condition.

8. A fabricating method as defined in clam 1, wherein diffusing the molecular chains of said uniaxially drawn film is performed by thermally treating said uniaxially drawn film at a temperature within a temperature range of the Curie temperature through the melting point of said vinylidene-trifluoroethylene or tetrafluoroethylene copolymer composing said uniaxially drawn film under a compressed condition.

9. A fabricating method as defined in claim 8, wherein the thermal treatment is carried out under a compressed condition of 0.2 MPa or over.

10. A fabricating method as defined in claim 9, wherein the thermal treatment is carried out under a compressed condition of 50 MPa or over.

11. A fabricating method as defined in claim 8, wherein the thermal treatment is performed so that the surfaces of said uniaxially drawn film parallel to the drawing direction are maintained in free surface condition.

12. A fabricating method as defined in claim 11, wherein the thermal treatment is performed so that said uniaxially drawn film is set on a base made of a non-adhesive material to said vinylidene-trifluoroethylene or tetrafluoroethylene copolymer in a gaseous atmosphere or a liquid atmosphere and then, said surfaces of said uniaxially drawn film are maintained in the free surface condition.

* * * * *